United States Patent
Morf et al.

(10) Patent No.: US 7,088,170 B2
(45) Date of Patent: Aug. 8, 2006

(54) MULTIPLEXER AND DEMULTIPLEXER

(75) Inventors: Thomas E. Morf, Gross (CH); Martin L. Schmatz, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/827,783

(22) Filed: Apr. 20, 2004

(65) Prior Publication Data

US 2004/0263236 A1 Dec. 30, 2004

(51) Int. Cl.
*H03K 17/693* (2006.01)
*H03K 17/62* (2006.01)
(52) U.S. Cl. .................................... 327/407; 327/408
(58) Field of Classification Search .................... None
See application file for complete search history.

(56) References Cited

U.S. PATENT DOCUMENTS

| | | | | |
|---|---|---|---|---|
| 3,614,327 A * | 10/1971 | Low et al. | .................. | 370/216 |
| 4,985,703 A * | 1/1991 | Kaneyama | .................. | 341/141 |
| 5,070,255 A * | 12/1991 | Shin | .......................... | 327/408 |
| 5,425,022 A | 6/1995 | Clark et al. | ................. | 370/58.3 |
| 5,744,995 A * | 4/1998 | Young | ........................ | 327/407 |
| 5,789,966 A | 8/1998 | Bechade | ...................... | 327/407 |
| 5,856,754 A * | 1/1999 | Yamashita | .................. | 327/407 |
| 6,351,152 B1* | 2/2002 | Reddy et al. | ................ | 326/105 |
| 2003/0222674 A1* | 12/2003 | Hachiya | ...................... | 326/30 |
| 2003/0234664 A1* | 12/2003 | Yamagata | ..................... | 326/30 |

FOREIGN PATENT DOCUMENTS

EP 0 305 771 8/1988

* cited by examiner

*Primary Examiner*—Tuan T. Lam
(74) *Attorney, Agent, or Firm*—Daniel P. Morris, Esq.; Perman & Green, LLP

(57) ABSTRACT

The multiplexer according to the invention comprises a first data input line (TL1) for incoming data (Data 1), a second data input line (TL2) for incoming data (Data 2), and a data output line (TL3) for outgoing data (Data out). The multiplexer further comprises a control line (20, 21, 22) for applying a control signal (clk) to a first switching means (T1, T3, T5; SR1, SR3, SR5) and a second switching means (T2, T4, T6; SR2, SR4, SR6) for alternatively connecting the first data input line (TL1) over the first switching means (T1, T3, T5; SR1, SR3, SR5) and the second input line (TL2) over the second switching means (T2, T4, T6; SR2, SR4, SR6) to the data output line (TL3), wherein the first and second switching means (T1–T6; SR1–SR6) are spatially arranged in such a way, that the control signal (clk) applied to the first switching means (T1, T3, T5; SR1, SR3, SR5) compared with the control signal (clk) applied to the second switching means (T2, T4, T6; SR2, SR4, SR6) shows a phase shift.

12 Claims, 3 Drawing Sheets

MULTIPLEXER AND DEMULTIPLEXER

TECHNICAL FIELD

The present invention relates to a distributed multiplexer with an extraordinary high switching rate and a corresponding demultiplexer.

BACKGROUND OF THE INVENTION

Multiplexers are electronic circuits which are used to combine two or more input data streams into one output data stream with appropriate higher bit rate. A multiplexer is a basic digital building block used in various applications ranging from data communication to telecommunication and data processing circuits like central processing units (CPU).

There are several approaches to implement electrical multiplexers. All of them rely on some sort of bipolar transistors or field effect transistors (FET) used as switches. By choosing different circuit topologies the speed performance of the multiplexer can be optimized. However, the finite switching speed of the available transistors will always be the limiting factor.

An embodiment of a conventional 2:1 multiplexer is shown in FIG. 1. The multiplexer comprises a so called Gilbert cell, which is controlled by a control or clock signal clk and switches depending on the clock signal clk either a first digital input signal C1 or a second digital input signal C2 to the multiplexer output OUT. For this purpose, the Gilbert cell includes switching transistors 1 to 6 and resistors 7 to 9. If for example the level of the clock signal clk is low and therefore the level of the inverted clock signal $\overline{clk}$ is high, the transistor 2 is nonconducting while the transistor 3 is conducting. In this case, only the second input signal C2 is switched to the output OUT. If the level of the clock signal clk is high, only the first input signal C1 is switched to the output OUT. As already mentioned, the switching speed of the multiplexer is limited because of the finite switching speeds of the transistors 1 to 6.

Using indium phosphide high electron mobility transistors (InP HEMT) a multiplexer with a bite rate of 90 Gb/s has been demonstrated in T. Suzuki, et. al., "A 90 Gb/s 2:1 Multiplexer IC in InP HEMT Technology", ISSCC 2002 Session 11, pp. 192–193, 2002. The speed limit for more conventional complementary metal oxide semiconductor (CMOS) devices is significantly lower due to the slower switching speed of CMOS devices compared to InP HEMTs.

EP0305771 A2, U.S. Pat. No. 5,789,966, U.S. Pat. No. 5,425,022 show examples of prior art multiplexers.

SUMMARY OF THE INVENTION

One object of the invention is to provide a multiplexer with an improved switching rate and in addition a corresponding demultiplexer which is capable to handle the high speed data stream received from the multiplexer.

According to one aspect of the invention, the object is achieved by a multiplexer with the features of the independent claim 1.

The multiplexer according to claim 1 comprises a first data input line for incoming data, a second data input line for incoming data and a data output line for outgoing data. The multiplexer also comprises a control line for applying a control signal to a first switching means and a second switching means for alternatively connecting the first data input line over the first switching means and the second data input line over the second switching means to the data output line, wherein the first and second switching means are spatially arranged in such a way, that the control signal applied to the first switching means compared with the control signal applied to the second switching means shows a phase shift.

According to another aspect of the invention, the object is achieved by a multiplexer with the features of the independent claim 7.

The multiplexer according to claim 7 comprises a first data input line for incoming data, a second data input line for incoming data and a data output line for outgoing data. The multiplexer further comprises a control line for applying a control signal to a first switching means and a second switching means for connecting the first data input line over the first switching means and the second data input line over the second switching means to the data output line, wherein the first and second switching means are spatially arranged in such a way, that a signal generated by the first switching means shows a phase shift compared to a signal generated by the second switching means, when the control signal occurs.

According to a further aspect of the invention, the object is achieved by a demultiplexer with the features of the independent claim 16.

The demultiplexer according to the invention comprises a data input line for incoming data, a first data output line for outgoing data, a second data output line for outgoing data, a control line for applying a control signal to a first switching means and a second switching means for alternatively connecting the data input line to the first data output line over the first switching means and to the second data output line over the second switching means. The first and second switching means are spatially arranged in such a way, that the control signal applied to the first switching means compared with the control signal applied to the second switching means shows a phase shift.

Advantageous further developments of the invention arise from the characteristics indicated in the dependent patent claims.

Preferably, the control line of the multiplexer according to the invention comprises a first control line section connected to the first switching means and a second control line section connected to the second switching means, wherein the first control line section is shorter than the second control line section. With that, the phase shift between the signal part of the common control signal, which is led to the first switching means, and the signal part of the common control signal, which is led to the second switching means, can be easily established.

Moreover, the distances between the connection points, which connect said switching elements to said data output line, can be equidistant.

In a further embodiment of the multiplexer according to the invention the first switching means comprises a first switching element and a second switching element, which are connected with their outputs between the first data input line and the data output line, and which are distributed in such a way, that partial signals generated by the switching elements in the data output line are in the same phase.

Advantageously, the control line of the multiplexer according to the invention is formed as differential control line. Thus, interferences can be reduced.

In another embodiment of the multiplexer according to the invention the first and second switching means comprise transistors.

Furthermore, in the multiplexer according to the invention the data input lines and the data output line can be connected over terminating resistors to a reference potential. With that, signal reflections can be avoided.

In another aspect of the invention the control line of the multiplexer comprises a first control line section for the first switching means and a second control line section for the second switching means, wherein the first and second control line sections are formed in such a way, that the control signal can be applied to the first and second switching means in phase.

The switching means of the multiplexer preferably comprise optically controlled switching elements. Thus, the switching rate of the complete multiplexer can be further increased.

The optically controlled switching elements of the multiplexer according the invention are typically formed as photo resistors.

The present invention also relates to a multiplexer, wherein the photo resistor contains low temperature grown GaAs.

The multiplexer according to the invention can furthermore comprise a pulse generator for generating the control signal.

The control line of the multiplexer is preferably formed in such a way that the first input line and the second input line can be simultaneously connected over the first and second switching means to the data output line.

Finally, the pulse generator of the multiplexer according to the invention can be formed in such a way, that it can generate a laser pulse.

In a further embodiment of the demultiplexer according to the invention the control line comprises a first control line section connected to the first switching means and a second control line section connected to the second switching means, wherein the first control line section is shorter than the second control line section.

In another embodiment of the demultiplexer the first switching means comprises a first switching element and a second switching element, which are connected with their outputs between the data input line and the first data output line, and which are distributed in such a way, that partial signals generated by the switching elements in the first data output line are in the same phase.

BRIEF DESCRIPTION OF THE DRAWINGS

The invention and its embodiments will be more fully appreciated by reference to the following detailed description of presently preferred but nonetheless illustrative embodiments in accordance with the present invention when taken in conjunction with the accompanying drawings.

The figures are illustrating.

DETAILED DESCRIPTION OF THE DRAWINGS

Figure 1:
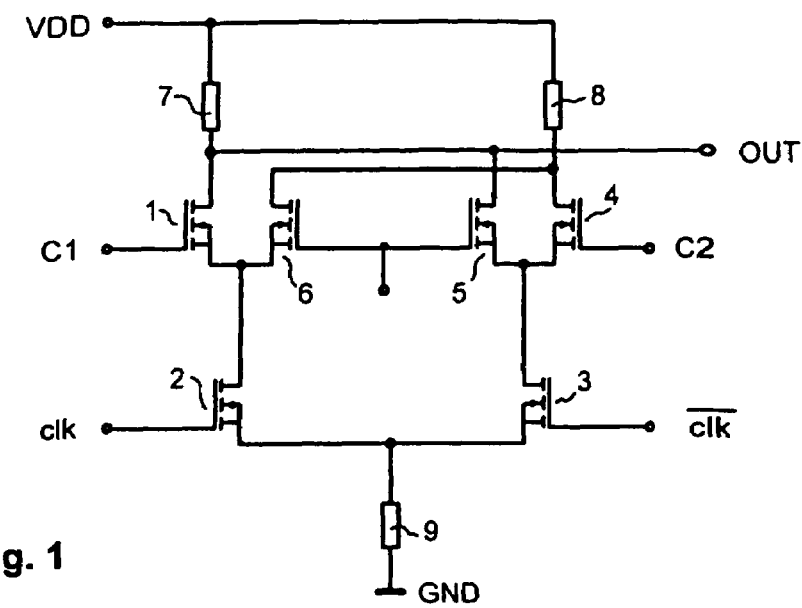
FIG. 1 a multiplexer in form of a Gilbert cell according to the prior art.

FIG. 1 shows a conventional multiplexer, which is formed out of a Gilbert cell. Regarding further explanations for this, it is referred to the section background of the invention of this application.

Figure 2:
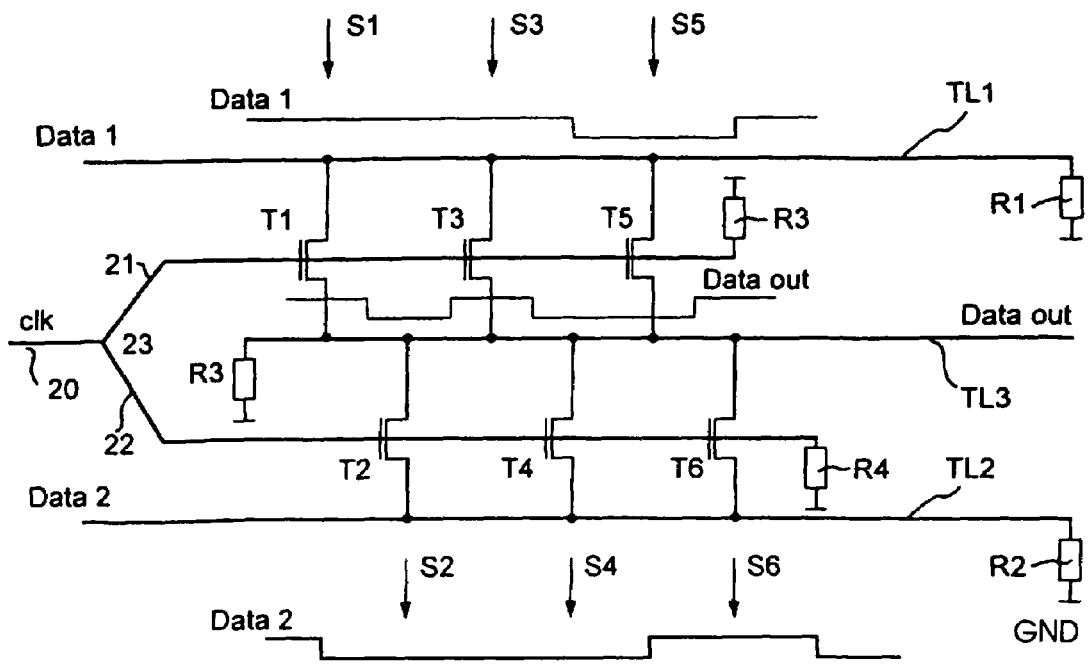
FIG. 2 a first embodiment of a multiplexer according to the invention having electrically controlled switching elements, FIG. 3 a more detailed representation of the first embodiment of the multiplexer according to the invention, FIG. 4 a second embodiment of the multiplexer according to the invention having optically controlled switching elements, FIG. 5 a third embodiment of the multiplexer according to the invention having optically controlled switching elements, and FIG. 6 an embodiment of a demultiplexer according to the invention having electrically controlled switching elements.

In FIG. 2 a simplified block diagram of a first embodiment of a distributed multiplexer according to the invention is depicted, which represents a 2 to 1 multiplexer. At the inputs of the multiplexer input signals Data 1 and Data 2 and a control signal in form of a clock signal clk are applied. The input signals Data 1 and Data 2 form the data streams, which shall be multiplexed and then form an output signal Data out. For this purpose, the multiplexer comprises a first transmission line TL1 which leads the first input signal Data 1 and a second transmission line TL2 which leads the second input signal Data 2. A third transmission line TL3, also called data output line or output transmission line, leads the output signal Data out. These three transmission lines TL1, TL2 and TL3 are phase matched transmission lines. Therefore, the phase velocities on the input and output transmission lines TL1, TL2 and TL3 are equal. Between the first input transmission line TL1 and the output transmission line TL3 three switching elements T1, T3 and T5 are arranged. Between the second input transmission line TL2 and the output transmission line TL3 further switching elements T2, T4 and T6 are arranged. The switching elements T1 to T6 can be for example FETs and are spatially distributed along the transmission lines TL1, TL2 and TL3. The common control signal clk is led over a common control line 20 to the closeness of the switching elements T1 to T6. Afterwards the common control line 20 is split up at branch 23 in an upper control line section 21 and a lower control line section 22, wherein the upper control line section 21 leads the control signal clk to the control inputs of the switching elements T1, T3 and T5 and whereas the lower control line section 22 leads the control signal clk to the control inputs of the switching elements T2, T4 and T6. As illustrated in FIG. 1, the path length from the branch 23 to the control input of the first switching element T1 is shorter than the path length from the branch 23 to the control input of the second switching element T2. Whereas the path length between the branch 23 and the control input of the third switching element T3 is longer than the path length between the branch 23 and the control input of the second switching element T2. Analogous, the above said is also valid for the path lengths between the branch 23 and the other switching elements T4 to T6. The consequence is that the control signal clk reaches at first the first switching element T1, then the second switching element T2, then the third switching element T3 and so on. Thus, phase shifts of the control signal clk arises between the individual switching elements T1 to T6. This is the case because the propagation of the control signal clk lasts differently long time for different path lengths.

It is noted that the splitting of the control line 20 is not required but works as well. In FIG. 2 it is drawn for clarity only.

Since the phase velocities on the input and output transmission lines TL1, TL2 and TL3 and the control lines 21 and 22 are equal, but there is a phase shift at the control line sections 21 and 22, the data signals Data 1 and Data 2 are alternatively sampled by the switching elements T1 to T6 along the output transmission line TL3 with a constant phase shift and form the output signal Data out. Each incoming bit is sampled and switched from the corresponding input transmission line TL1 or TL2 to the output transmission line TL3 by the corresponding switching means T1, T3 and T5 or T2, T4 and T6 as it travels down the input transmission line TL1 or TL2 respectively. Since the clock signal clk, the input data signals Data 1 and Data 2, and the output data signal Data out travel with equal phase velocity on their transmission line, the sampled signal is added in phase and results in a larger output signal Data out even if the transistors T1 to T6 are operated above their normal speed limit.

The signal pattern above the block diagram of the multiplexer shows the first input data stream Data 1 and the signal pattern below the block diagram of the multiplexer shows the second input data stream Data 2. The samples are indicated with S1 to S6. The corresponding signal pattern for the output data signal Data out resulting from the samples S1 to S6 is drawn in FIG. 2 along the output transmission line TL3. The three signal patterns show the corresponding signals Data 1, Data 2 and Data out at one moment in time. The signals Data 1, Data 2 and Data out travel along the transmission lines TL1, TL2 and TL3 from left to right. However, the line lengths do not have to be as long as shown in FIG. 2. A signal representing a bit can be longer on the line then e.g. the length of the transmission line TL1. The way $s_{bit}$ a bit covers can be determined to $s_{bit}=v*t_{bit}$, wherein v is the propagation speed and $t_{bit}$ the bit residence time. Given this, the way the signal covers on the transmission line TL1 during the bit residence time $t_{bit}$ or period of the signal can be longer than the length of the transmission line TL1.

All unused terminals of the transmission lines TL1, TL2, TL3 and clock lines 21 and 22 are terminated by a line impedance R1, R2, R3, and R4 respectively to avoid reflections.

Due to the distributed nature of the circuit, multiplexers with significantly higher speed can be realized compared to today's solutions.

Figure 3:
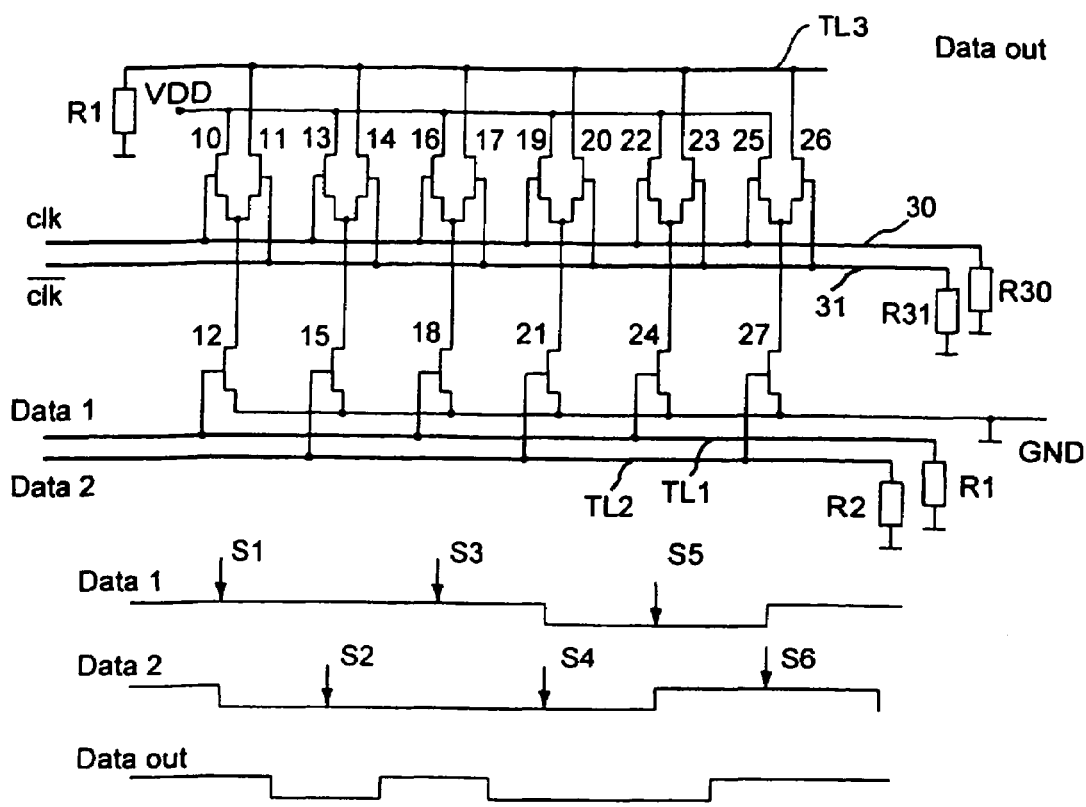

A more detailed schematic diagram of the distributed multiplexer according to the invention is shown in FIG. 3. The embodiment of the multiplexer shown in FIG. 3 comprises altogether six switching elements, wherein each switching element comprises three transistors, for example the first switching element comprises the transistors 10, 11 and 12, and the second switching element comprises the transistors 13, 14 and 15. The switching elements are realized as differential amplifiers with switched current source. For example, the differential amplifier of the first switching element comprises the transistors 10 and 11. The switched current source of the first switching element is formed by the transistor 12, which is also called data transistor. The first data signal Data 1 controls the current sources 12, 18 and 24, whereas the second data signal Data 2 controls the current sources 15, 21 and 27. The clock signal clk controls the differential stages of the switching elements. The current imposed by the data transistors 12, 15, 18, 21, 24 and 27 is switched to either of the two outputs of the corresponding differential stage. The unused output of the differential amplifier, e.g. the output of the transistor 10, is connected to a supply line VDD. The used output of the differential amplifier, e.g. the output of the transistor 11, is connected to the output transmission line TL3. Each of the switching elements exhibits a certain gain.

In one embodiment of the multiplexer the clock signal clk fully switches the differential stages while the data signals Data 1 and Data 2 are relatively small signals.

Care should be taken to achieve an equal phase velocity on all transmission lines TL1, TL2 and TL3 and the control lines 30 and 31. The transmission line impedance can be chosen as high as physically possible, since it will be capacitively loaded by the input and output capacitances of the FETs. This will result in a lowered impedance. A preferred design goal is to achieve 50 Ohm including this loading effect. Instead of a high impedance transmission line, lumped spiral inductors can also be used. All transistors 10–27 can be formed as FET.

The distributed multiplexer according to the invention can also be based on optically clocked switches. The optically clocked switches can be realized using low temperature grown Gallium Arsenide (LT-GaAs) photo resistors. The clock source can be a mode locked laser, which is capable of generating very short optical pulses. The laser can be synchronized to an external electrical clock source. Due to the very fast switching speed of the LT-GaAs photo resistors, and the short optical pulses of the laser, a multiplexer with significantly higher speed can be realized compared to today's solutions.

LT-GaAs is GaAs which has been grown at very low temperatures compared to regular growth temperatures. This results in material which has extremely short carrier life time. Further explanations relating to this material can be gathered from "Ultrafast Differential Sample and Hold Using Low-temperature-Grown GaAs MSM for Photonic A/D Conversion", IEEE Photonics Technology Letters, vol. 13, no. 7, July 2001, pp.717 . . . 719.

The advantage of the above mentioned optically clocked switches is that the conducting path closes, this means gets nonconducting or high-impedance very fast after the light has been turned off due to the fact that excess carriers recombine with a very short time constant. Using simple lift off process metal pattern can be applied onto the LT-GaAs. By placing transmission lines with small gaps (switch) a very fast electrical switch can be realized. Achievable pulse widths are in the sub picoseconds (<1E-12 seconds) range, which is more than an order of magnitude faster than practicable with any transistor technology.

In order to trigger such an optically clocked switch an optical pulse is required. There are several optical pulse sources known.

Titan-Sapphire laser is a commercially available pulse source. Such a laser has an average power in the hundreds of milliwatt, repetition rates up to 2.5 GHz and pulse widths in the picoseconds or significantly below depending on repetition rate. This results in peak power in the watt to kilowatt range.

A more compact implementation is a mode locked laser. With this type of laser repetition rates in the tens of GHz are easily achievable today. More then 100 GHz repetition rate have been demonstrated in "High-repetition frequency pulse generation at 102 GHz using mode-locked lasers integrated with electro absorption modulators", K. Sato, et. al., Electronics Letters, vol. 34, no. 8, 16. April 1998. A mode locked laser readily achieves pulse widths in the picosecond range and peak powers in the watts. This is sufficient for triggering optically clocked switches comprising LT-GaAs photo resistors.

Both, the titan-sapphire laser and the mode locked laser, can be easily locked to an external electrical signal, which is required in order to use such lasers as optical clock sources. If optically clocked switches based on LT-GaAs are used, the laser wavelength must be above the band gap of GaAs, 850 nm would works fine. As an alternative wavelength 1.5 µm laser light can also be used. However, for this wavelength GaAs has to be replaced by optically clocked switches based on e.g. InGaAs. Such devices have also been demonstrated in "Subpicosecond nonlinear absorption recovery dynamics of low-temperature-grown In 0.53 Ga 0.47 As/In 0.52 Al 0.48 As multiple quantum well p-i-n structures", P. Juodawlkis, et. al. OSA TOPS on Ultra fast Electronics and Optoelectronics, 1997, Vol. 13, 1997. Optically clocked switches based on InGaAs are an alternative to optically controlled switches based on GaAs. However, the material system is not as mature.

State of the art mode locked lasers achieve repetition rates up to 100 GHz. However, with such high repetition rates the peak power is diminished. In order to be able to use an easy available laser with more moderate repetition rates, two different architectures are proposed.

Figure 4:
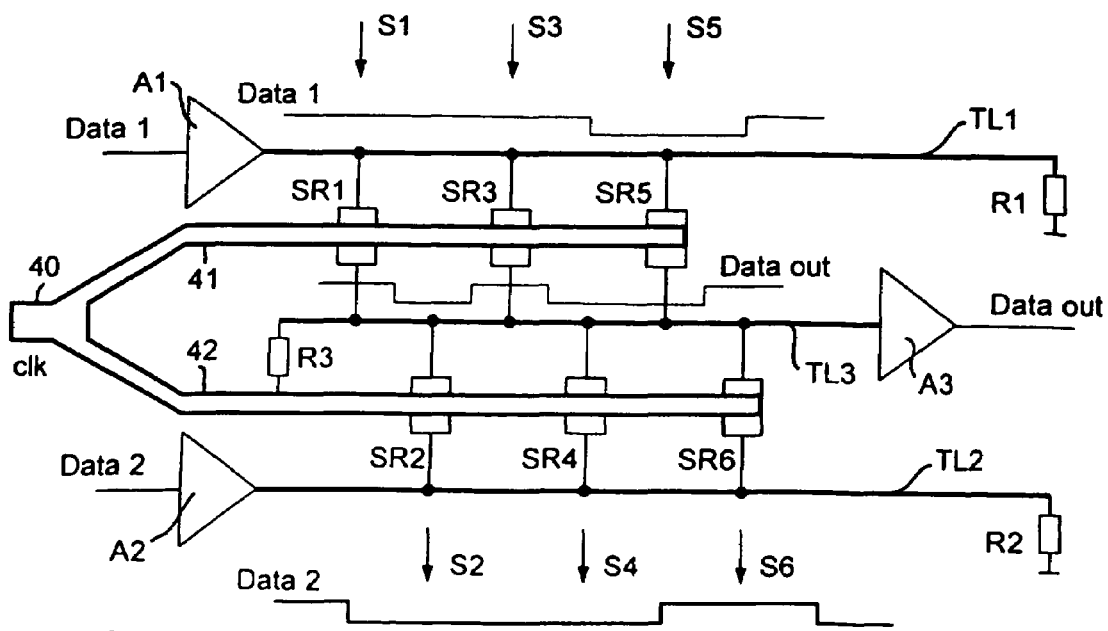

1) Distributed multiplexer with alternative sampling:

For multiplexers with an input output ratio of 4:1 or even 8:1 the distributed approach depicted in FIG. 4 is suggested. A laser with e.g. 20 GHz repetition rate is sufficient for 20 Gb/s input speed per channel, resulting in 80 Gb/s for a 4:1 or 160 Gb/s for a 8:1 multiplexer.

Figure 5:
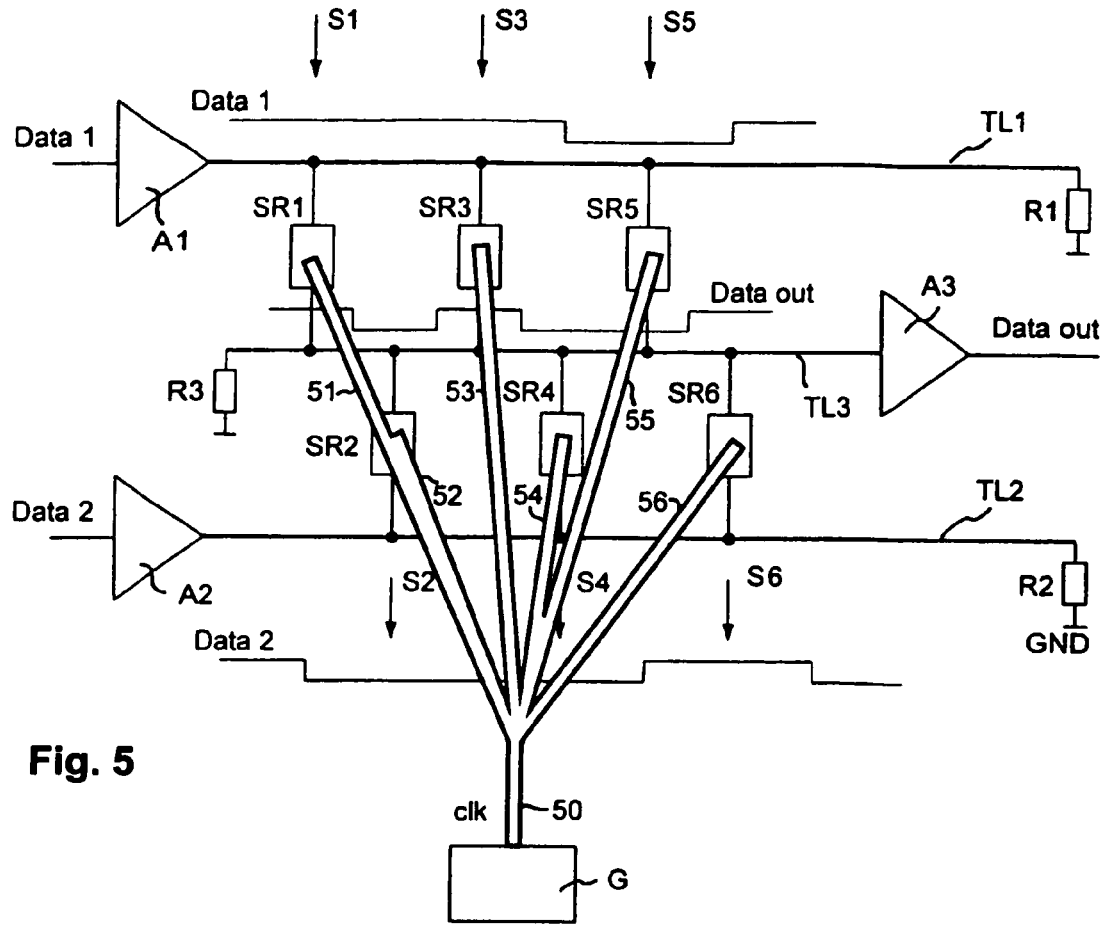

2) Multiplexer with parallel sampling:

For very fast multiplexers and 2:1 multiplexing ratios, the architecture with parallel sampled input data signals shown in FIG. 5 would be more appropriate.

In the following, the first architecture with an alternative sampling of the input data signals is explained. Such a distributed multiplexer with optically clocked switches can be realized as shown in FIG. 4. The incoming electrical data streams or data signals Data 1 and Data 2 are amplified in ultra wide band amplifiers A1 and A2. The amplifiers A1 and A2 can be for example traveling wave amplifiers. Achievable bandwidths for such devices are well above 100 GHz. 180 GHz with 5 dB gain was already demonstrated in "112-GHz, 157-GHz and 180-GHz InP HEMT Traveling-Wave Amplifier", B. Agarwal et. al., IEEE Trans. On Microwave Theory and techniques Vol. 46, No.12, December 1998.

The six sampling resistors SR1 to SR6 and the transmission lines TL1, TL2 and TL3 are implemented on e.g. LT-GaAs as described above. Physically the transmission lines TL1, TL2 and TL3 could be formed as coplanar lines. The sampling resistors SR1 to SR6 are integrated in narrow gaps in the lines where the metallization of the transmission lines is in direct contact with the LT-GaAs switches.

As already explained above, the vertical arrows marked with the reference signs S1 to S6 in FIG. 4 indicate the sampling positions. The signal pattern above the block diagram of the multiplexer shows the first input data stream Data 1 and the signal pattern below the block diagram of the multiplexer shows the second input data stream Data 2. The corresponding signal pattern for the output data signal Data out resulting from the samples S1 to S6 is drawn in FIG. 4 along the output transmission line TL3. The three signal patterns show the corresponding signals Data 1, Data 2 and Data out at one moment in time. The signals Data 1, Data 2 and Data out travel along the transmission lines TL1, TL2 and TL3 from left to right. However, the line lengths are not required to be longer than a bit length on the line as shown in FIG. 4. in order for the concept to be functional. It is just drawn like this for clarity.

An optical signal, e.g. a light pulse, forms the clock clk and is distributed with wave-guides or optical fibers 40, 41 and 42. The timing is critical for the distributed multiplexer with alternative sampling. The propagation velocity of the electrical signal on the transmission lines TL1, TL2 and TL3 and the optical signal clk in the wave guides 40, 41 and 42 should be equal. Meandered lines can be used for length compensation if the propagation velocities are unequal.

In this embodiment of a distributed multiplexer with alternative sampling each bit is sampled several times, in the example shown in FIG. 4 three times. Due to phase matching the sampled signals are added in phase increasing the sensitivity. Relatively high optical power is required to achieve on resistance of the optically clocked switches, which are in the order of the transmission line impedance. At these speeds 50 Ohm transmission lines TL1, Tl2 and TL3 and amplifiers A1, A2 and A3 are commonly used.

The optical clock source is preferably a mode locked laser, which is locked to the external clock frequency. The multiplexed data signals Data 1 and Data 2 form the output data signal Data out, which is finally amplified in a third traveling wave amplifier A3.

The speed limits of such a multiplexer are given by the bandwidths of the amplifiers A1, A2 and A3, the laser pulse widths and repetition rates and the switching speed of the optically clocked switches based on LT-GaAs. Lasers achieve pulse widths in the picoseconds or below. Switching speeds of optically clocked switches based on LT-GaAs are also in the range of picoseconds and amplifiers up to 200 GHz are also available. However, laser repetition rates combined with high optical peak power are the limiting factor. A laser with a 20 GHz repetition rate is sufficient for 20 Gb/s input per channel or 50 GHz repetition rate for 50 Gb/s input per channel. Assuming a 4:1 multiplexer, a laser with a 20 GHz repetition rate would result in 80 Gb/s and a laser with a 50 GHz repetition rate in 200 Gb/s output speed respectively. For a 8:1 multiplexer this would result in 160 Gb/s and 400 Gb/s output speed respectively. This might require multiple synchronized mode locked lasers to achieve the required optical peak power for the large number of photo resistors. For higher speeds or lower multiplexing ratios the architecture in FIG. 5 would be more appropriate.

In the following, the second architecture with parallel sampled input data is described. Compared to the distributed multiplexer shown in FIG. 4 the architecture depicted in FIG. 5 has a different optical clock distribution. The clock is simultaneously distributed to all switches, which therefore are clocked simultaneously without a phase shift in the clock signal. All other features are identical. The idea is that a bit stream of 3 to 10 bits is sampled in parallel. In the embodiment shown in FIG. 5 three bits of each transmission line TL1 and TL2 are sampled in parallel. Therefore, always a block of three bits, also called bit frame, is sampled at once. The positions where the bits are sampled are indicated with the arrows marked with the reference signs S1 to S6. The next sample pulse is required after the whole bit frame consisting of 3 bits has traveled on the transmission lines TL1 and TL2 respectively, has passed all optically controlled switches SR1 to SR6 working as sampling gates, and has been replaced by the next bit frame. Note, that in FIG. 5 the different path lengths of paths 51–56 leading the clock clk to the switches SR1–SR6 do not necessarily implicate a different propagation time for the clock clk to reach the switches SR1–SR6. Instead, clock signal clk arrives at switches SR1–SR6 simultaneously—which means in phase—and thus triggers switches SR1–SR6 simultaneously, which causes a simultaneous sampling of data samples S1–S6. Due to the spacing between the switches SR1–SR6, switches SR1–SR6 generate individual signals on the data output line TL3 which form together the outgoing data Data out, being assembled by the samples S1–S6.

If e.g. five sampling resistors are provided for each input line TL1 and TL2, this would result in a five times lower repetition rate compared to the approach in FIG. 4 because in this case a bit frame consisting of five bits is sampled at once. A 20 GHz repetition rate laser is sufficient for 20 G*5=100 Gb/s input data rate.

As far as the other components of the multiplexer are concerned the description of the distributed multiplexer with alternative sampling can be applied to this architecture as well.

The described embodiments of the multiplexers are not restricted to 2:1 multiplexers but can also be extended to n:1 multiplexers, wherein n depends on the technical requirements.

In the following the structure and operation of a demultiplexer based on the above mentioned principles is explained.

The above concepts of a distributed multiplexer can also be applied to a demultiplexer. The concepts are applicable for an electrically or also for an optically clocked version of the demultiplexer.

Compared to a multiplexer the demultiplexer produces output signals Data 1 out and Data 2 out with longer bit periods. A short input bit Data in is sampled by an even shorter sampling pulse clk. Therefore, it needs to be extended to the correct bit length in order to prevent severe glitches or even changing part of the data stream from non return to zero (NRZ) to return to zero (RZ) signals. For the case of a 2:1 demultiplexer the bit lengths need to be doubled.

Figure 6:
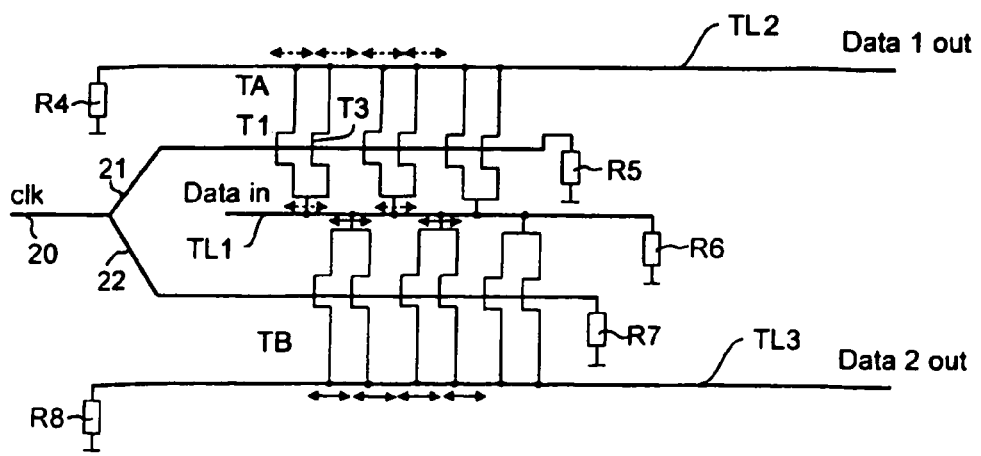

A simplified schematic of an electrically clocked distributed demultiplexer is shown in FIG. 6. Compared to the distributed multiplexer shown in FIG. 5 each incoming bit Data in is added twice on the appropriate output line TL1 or TL3 with a delay so the resulting bit Data 1 out or Data 2 out has twice the length. This is made e.g. by the help of the transistors T1 and T3 of the switching means TA. The incoming high speed bits are alternatively coded with dotted line and straight line arrows. All the bits indicated with the dotted line arrows are transferred to the Data 1 output line TL2 and all the bits indicated with the straight line arrows are transferred to the Data 2 output line TL3.

Care should be taken to remain equal phase velocity on the input line TL1 and output lines TL2 and TL3. Once again all lines should be terminated by its line impedance R4–R8.

An optical implementation of the distributed demultiplexer looks similar to the embodiment shown in FIG. 6. Only the transistors of the switching means TA and TB are replaced by LT-GaAs switches and the clock line 20, 21, 22 is replaced by an optical waveguide.

Higher demultiplexing ratios can be achieved by adding the appropriate number of switching elements to lengthen the signal.

Having illustrated and described a preferred embodiment for a novel method and apparatus for, it is noted that variations and modifications in the method and the apparatus can be made without departing from the spirit of the invention or the scope of the appended claims.

The invention claimed is:

1. A multiplexer comprising:
a first data input line (TL1) for incoming data (Data 1), a second data input line (TL2) for incoming data (Data 2), a data output line (TL3) for outgoing data (Data out), a control line (20, 21, 22; 40, 41, 42) for applying a control signal (clk) to a first switching means (T1, T3, T5; SR1, SR3, SR5) and a second switching means (T2, T4, T6; SR2, SR4, SR6) for alternatively connecting said first data input line (TL1) over said first switching means (T1, T3, T5; SR1, SR3, SR5) and said second data input line (TL2) over said second switching means (T2, T4, T6; SR2, SR4, SR6) to said data output line (TL3), and wherein each of said first data input line and said second data input line and said data output line and said control line is a transmission line having a predetermined value of phase velocity;
wherein said first switching means comprises a plurality of switching elements connected in parallel between said first data input line and said data output line and being spaced apart along said first data input line and said data output line;
wherein said second switching means comprises a plurality of switching elements connected in parallel between said second data input line and said data output line and being spaced apart along said second data input line and said data output line;
wherein spacings between successive ones of the switching elements along their respective transmission lines introduce phase shifts imparted by the transmission lines to signals propagating along the respective transmission lines; and
wherein said first and second switching means (T1–T6; SR1–SR6) are spatially arranged in such a way, that said control signal (clk) when applied to said first switching means (T1, T3, T5; SR1, SR3, SR5) compared with said control signal (clk) when applied to said second switching means (T2, T4, T6; SR2, SR4, SR6) shows a phase shift for sequencing a succession of switchings of signals between the input and the output transmission lines.

2. A multiplexer according to claim 1, wherein said control line (20, 21, 22; 40, 41, 42) comprises a first control line section (21) connected to said first switching means (T1, T3, T5; SR1, SR3, SR5) and a second control line section (22) connected to said second switching means (T2, T4, T6; SR2, SR4, SR6), wherein said first control line section (21) is shorter than said second control line section (22).

3. A multiplexer according to claim 1, wherein the distances between the connection points, which connect said switching elements (T1–T6; SR1, SR6) to said data output line (TL3), are equidistant.

4. A multiplexer according to claim 1, wherein said first switching means (T1, T3, T5; SR1, SR3, SR5) comprises a first switching element (T1; SR1) and a second switching element (T3; SR3), which are connected with their outputs between said first data input line (TL1) and said data output line (TL3), and which are distributed in such a way, that partial signals generated by said switching elements (T1, T3) in said data output line (TL3) are in the same phase.

5. A multiplexer according to claim 1, wherein said control line (20, 21, 22) is formed as differential control line (30, 31).

6. A multiplexer according to claim 1, wherein said first and second switching means comprise transistors (T1–T6).

7. A multiplexer according to claim 1, wherein said data input lines (TL1, TL2) and said data output line (TL3) are connected over terminating resistors (R1, R2, R3) to a reference potential (GND).

8. A multiplexer according to claim 1, wherein said first switching means and said second switching means comprise optically controlled switching elements (SR1–SR6).

9. A multiplexer according to claim 8, wherein said optically controlled switching elements (SR1–SR6) are formed as photo resistors.

10. A multiplexer according to claim 9, wherein said photo resistor contains low temperature grown GaAs.

11. A multiplexer according to claim 1, comprising a pulse generator (G) for generating said control signal (clk).

12. A multiplexer according to claim 11, wherein said pulse generator (G) is formed in such a way, that it generates a laser pulse.

* * * * *